United States Patent [19]
Busch et al.

[11] Patent Number: 5,754,046
[45] Date of Patent: May 19, 1998

[54] METHOD FOR THE ACQUISITION AND EVALUATION OF DATA IN A NUCLEAR MAGNETIC RESONANCE TOMOGRAPHY APPARATUS VIA UPDATING K-SPACE DATA IN A CONSTANT SUBREGION THEREOF

[76] Inventors: Martin Busch, Hevener Str. 50 a, 58455 Witten; Michael Friebe, Varenholzstr. 144, 44869 Bochum, both of Germany

[21] Appl. No.: 736,446

[22] Filed: Oct. 24, 1996

Related U.S. Application Data

[63] Continuation of Ser. No. 247,083, May 20, 1994, abandoned.

[30] Foreign Application Priority Data

May 21, 1993 [DE] Germany ............... 43 17 028.5

[51] Int. Cl.$^6$ .................................................. G01N 24/08
[52] U.S. Cl. .................................... 324/309; 324/307
[58] Field of Search .................................... 324/300, 307, 324/309, 316, 318; 128/653.2; 382/128, 130, 134

[56] References Cited

U.S. PATENT DOCUMENTS

| | | |
|---|---|---|
| 4,830,012 | 5/1989 | Riederer. |
| 5,109,854 | 5/1992 | Provost ............................ 324/309 |
| 5,168,226 | 12/1992 | Hinks. |
| 5,276,397 | 1/1994 | Kawasaki ......................... 324/300 |
| 5,304,928 | 4/1994 | Takeda ............................. 324/309 |

OTHER PUBLICATIONS

"Composite k-Space Windows (Keyhole Techniques) To Improve Temporal Resolution in a Dynamic Series of Images Following Contrast Administration," Brummer et al., Book of Abstracts, Society of Magnetic Resonance in Medicine, 1992.

"Patent Abstracts of Japan," Japanese Published Application 4-246327 Sep. 1992.

"Keyhole Imaging Offers Shortcut To Fast MR Scans," Diagnostic Imaging, Feb. 1983, p. 36.

*Primary Examiner*—Sandra L. O'Shea
*Assistant Examiner*—Michael Eisenberg
*Attorney, Agent, or Firm*—Hill, Steadman & Simpson

[57] ABSTRACT

In a method for the acquisition and evaluation of data obtained in a nuclear magnetic resonance tomography apparatus, only data for a constant sub-region of an overall dataset, that was obtained from a preceding measurement, are updated by new measured data in subsequent successive measurements (keyhole method). In order to sharply reproduce measurement subjects in the visual display which move from measurement to measurement while only slightly lengthening the registration time in comparison to a standard keyhole measurement sequence, data for difficult sub-regions of the overall dataset are additionally updated from measurement to measurement, and these sub-regions are varied in a predetermined sequence from measurement to measurement.

3 Claims, 3 Drawing Sheets

METHOD FOR THE ACQUISITION AND EVALUATION OF DATA IN A NUCLEAR MAGNETIC RESONANCE TOMOGRAPHY APPARATUS VIA UPDATING K-SPACE DATA IN A CONSTANT SUBREGION THEREOF

This is a continuation of application Ser. No. 08/247,083, filed May 20, 1994, now abandoned.

BACKGROUND OF THE INVENTION

1. Field of the Invention

The present invention is directed to a method for the acquisition and evaluation of data in a nuclear magnetic resonance tomography apparatus, wherein only a constant sub-region of a total dataset that was obtained from a preceding measurement is updated by measured data of a subsequent measurement, in successive measurements.

2. Description of the Prior Art

In a nuclear magnetic resonance tomography apparatus, spatially defined subregions of a subject to be examined are first selected by activating magnetic gradient fields, and are excited with RF pulses. The overall magnetization in the selective, spatial sub-region is deflected from the equilibrium position into the magnetic field direction by the RF pulses, whose frequency coincides with the resonant frequency of the atomic nuclei in the selected sub-region. As a result of the precessional motion of the overall magnetization thereby arising, measured signals are induced in a reception coil. These measured signals are registered and evaluated.

The phase and frequency of each of the measured signals are spatially coded by suitably fashioning the magnetic gradient fields. The spatial distribution of the excited nuclear spins can thus be identified from a dataset containing the phase and frequency data. A transformation of the phase and frequency data, in the reciprocal or k-space, into length and width data in real space is required for the visual display of these measured data. For example, this transformation is implemented with Fourier transformation.

In the known methods, the data acquisition is initiated by conducting a standard measurement sequence. In such a standard measurement sequence, a plurality of two-dimensional or three-dimensional overall datasets are acquired from a three-dimensional subject as a rule. The number of measured data entries in the overall dataset arises from the number of phase and frequency steps traversed in a measurement. The registration of one or more measured signals corresponds to each phase step. Each registered measured signal is then digitized.

A chronologically resolved visual monitoring of chronologically variable events using nuclear magnetic resonance tomography can be accomplished using a series of measurements that follow one another with adequate rapidity. Such fast measurements are necessary, for example, in the monitoring of endoscopic surgical interventions, wherein there is no direct visual contact to the surgical instruments and to the region of the operation from the exterior of the patient. Such monitoring is also necessary in the diagnosis of moving organs such as, for example, the heart. A chronologically successive repetition of a standard measurement sequence is too slow for these purposes.

A technique known as the keyhole method is known in the prior art for shortening the registration time. This method is directed to a reduction of the measured data to be acquired and to an optimized evaluation strategy.

In a keyhole measuring sequence, as described in the article "Keyhole Imaging Offers Shortcut to Fast NMR Scans", Diagnostic Imaging, February 1983, page 36, a complete, overall dataset is first acquired with the aforementioned standard measurement sequence. Thereafter, only data for a constant, small sub-region of the measured data are updated in the currently existing, overall dataset in the following measurements. The majority of the overall dataset obtained from the initial standard measurement sequence, by contrast, remains unmodified. A considerable speed-up arises due to the updating of the measured data in only a small sub-region of the overall dataset.

Due to the nature of the overall dataset in the k-space, essentially only a small region around the center of the overall dataset is relevant for the portrayal of structuring in, and for the signal-to-noise ratio of, the transformed, real image. The low spatial frequencies and their phase relations are localized in this central region. When, in the keyhole method, only this sub-region is updated from measurement to measurement, this results in the relatively quick production of good, real images having adequate contrast and an adequate signal-to-noise ratio, given an examination subject at rest.

In one version of the known keyhole method, a narrow sub-region of measured data is identified along an entire measured coordinate axis, for example, the axis along which frequency is entered. This can be achieved, for example, by limiting the registered measured signals to a narrow phase region. Also critical for the selection of the subregion of the measured data is that the aforementioned, central region of the overall dataset be contained in the sub-region of the acquired and updated measured data.

The critical disadvantage of the keyhole method is that changes of the measured subject that occurred during the course of a series of keyhole measurements are displayed with inadequate edge sharpness in the image presentation. Given moving examination subjects, pronounced misrepresentations can occur, exhibiting partly undefined local information. This can lead to the fact that a chronological monitoring of surgical interventions becomes impossible because the instruments being employed and introduced into the measured subject cannot be localized with adequate precision. Consequently, the temporal advantages achieved by the keyhole method can only be poorly utilized.

SUMMARY OF THE INVENTION

It is an object of the present invention to improve or modify the keyhole method so that measured subjects moving from measurement to measurement are reproduced more sharply in the image presentation, while maintaining the registration time relatively short in comparison to a standard sequence.

In order to achieve this object, the method of invention changes the sub-regions of the overall dataset whose data are updated from measurement to measurement, these sub-regions being varied in a predetermined sequence from measurement to measurement.

The inventive method has the advantage that the registration time is lengthened only slightly in comparison to the standard keyhole measurement sequence but this affords the possibility of clearly enhancing the edge sharpness in the visual presentations of the registered measurement. This is achieved, for example, by dividing (resolving) regions of the overall dataset which are relevant for the edge sharpness into sub-regions, and updating the data of these sub-regions according to a prescribed sequence. Due to the updating of the respective data of the individually changing, small sub-regions of the overall dataset, in addition to updating the data of the constant sub-region of the keyhole method, it is assured that the registration time is only slightly lengthened for a measurement in comparison to the conventional keyhole method.

Monitoring invasive interventions in real time can be accomplished using the method of the invention. Even extremely small surgical instruments, for example, endoscopic tools, are adequately recognizable in the image display. This property is a great advantage especially due to the increasing tendency toward minimally invasive interventions with endoscopic methods.

DESCRIPTION OF THE DRAWINGS

Exemplary embodiments of the method of the invention shall be set forth below with reference to the illustrations. The datasets shown in FIGS. 1–4 refer without exception to measured data present in the k-space.

DESCRIPTION OF THE PREFERRED EMBODIMENTS

Figure 1:
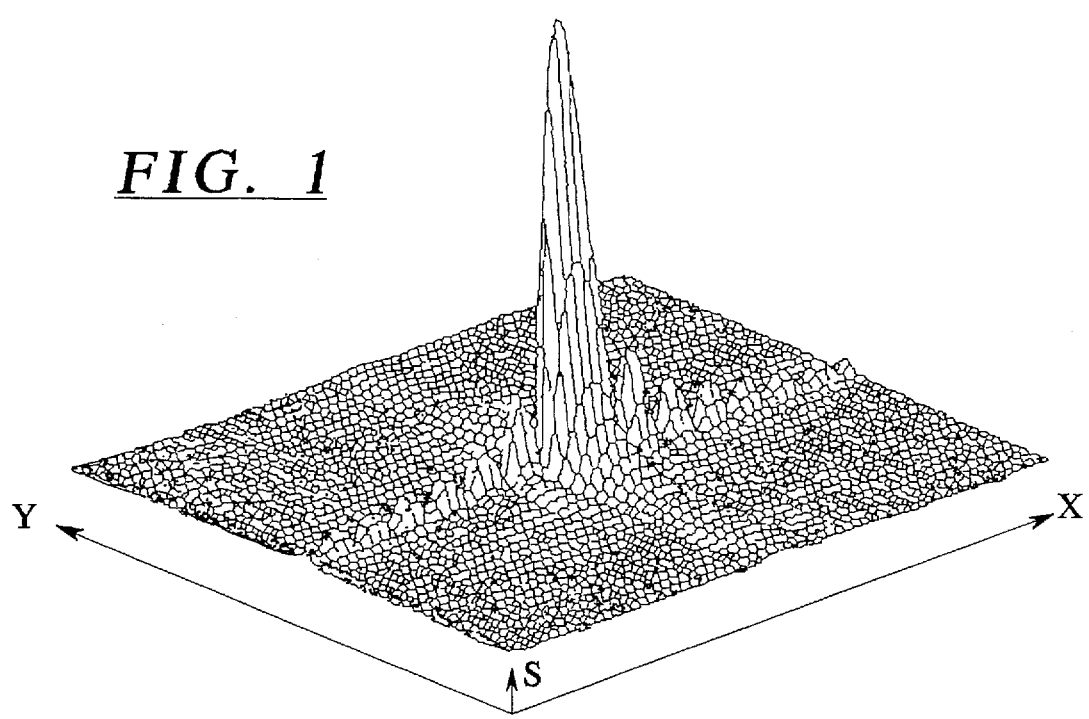
FIG. 1 shows an overall dataset of a two-dimensional magnetic resonance measurement, whereby the topically dependent signal amplitude is shown in perspective.

FIG. 1 shows an overall dataset of a two-dimensional measurement in the k-space in a phase-frequency diagram. In the diagram, the frequency coordinate axis is referenced X, the phase coordinate axis is referenced Y, and the measured signal amplitude coordinate axis is referenced S. The individual measured data lie on the intersections of a network whose mesh width in the X-coordinate direction is defined by the size of the frequency steps and is defined in the Y-coordinate direction by the size of the phase steps. The measured signal amplitude entered in the S-coordinate direction can be recognized in the perspective illustration of the network as an elevation. A large height in the diagram corresponds to a correspondingly high measured signal amplitude. It can be seen in a simple way that the measured signal amplitude is highest in the central region of the diagram; proceeding therefrom, relatively significant structures are only found along the X and Y-coordinate axes.

Figure 2:
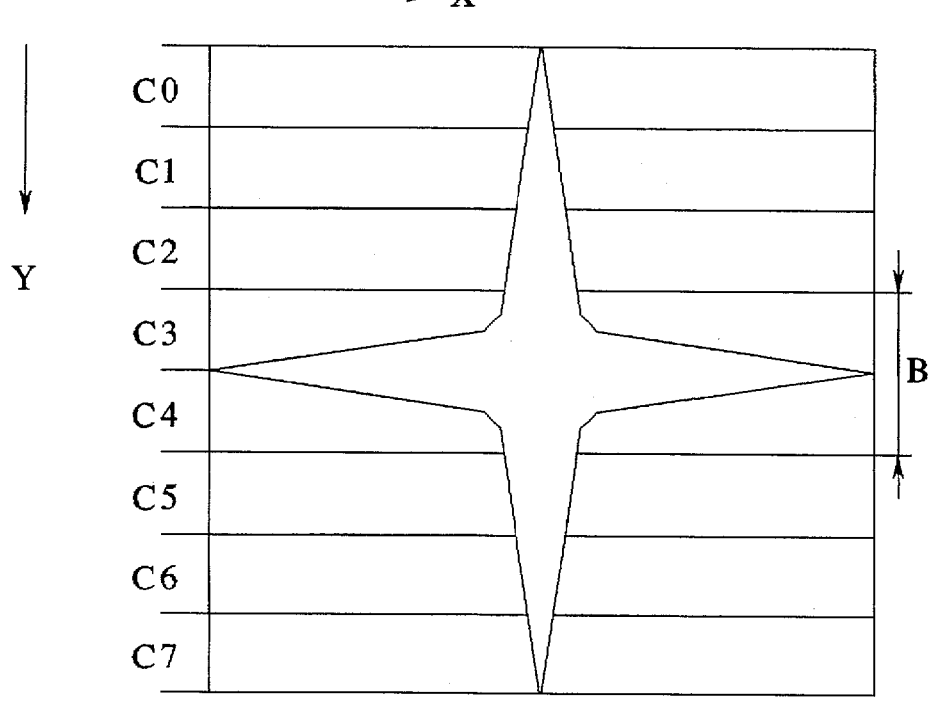
FIG. 2 is a schematic illustration of a measuring method of the invention in a two-dimensional measurement sequence, and wherein the entire, illustrated overall dataset is cyclically updated, and wherein those regions of the overall dataset that are primarily relevant for the image display are shown simplified with shading.

FIG. 2 shows a schematic illustration of a two-dimensional overall dataset similar to that shown in FIG. 1. In this diagram, too, the frequency coordinate axis is referenced X and the phase coordinate axis is referenced Y. The illustration of the measured data has ensued in a simplified way; the sub-regions of the overall dataset that are especially relevant for the image display, these being recognizable in FIG. 1 as significant elevations, are hereby emphasized by shading. The especially high measured signal amplitude in the middle of FIG. 1 is also found in this illustration in the center of the star-shaped, shaded data region.

In a standard keyhole measurement sequence, the entire illustrated overall dataset is first acquired. In the following measurements, only data in a respective excerpt from the overall dataset are updated. In FIG. 2, the width of this excerpt in the Y-coordinate direction is referenced B. The area of this so-called keyhole extends over the entire measured region width in the X-coordinate direction. The especially important measured data in the center of the coordinate system and the measured data adjoining thereto in the X-coordinate direction (collectively forming the keyhole) are updated from measurement to measurement subsequent in successive measurements. The subregions extending from the central region in the Y-coordinate direction, wherein significant measured data also lie, are not updated during the course of a standard keyhole measurement sequence.

Measured data are acquired as follows according to a conventional keyhole measurement sequence having a plurality, such as eight, of successive measurements:

1. Overall dataset.
2. Sub-region B (=keyhole)
3. Sub-region B (=keyhole)
8. Sub-region B (=keyhole).

In a measurement sequence of the invention, by contrast sub-regions C0, C1, C2, C5, C6, C7 that change from measurement to measurement are registered in addition to the constant keyhole region B. In the illustrated example, the overall dataset minus the keyhole region B is thus divided into the six sub-regions, each of which respectively comprises a width C0, C1, C2, C5, C6 or C7 in the Y-coordinate direction and each of which respectively extends over the entire width of the measured region in the X-coordinate direction.

The sub-regions C0, C1, . . . , C7 can be of equal width in the Y-coordinate direction, or can vary in terms of their dimensions. The number of changing sub-regions can also be selected as desired.

In a measurement sequence of the invention, sub-regions of the overall dataset are acquired in a sequence of measurements according to the sequence recited below:

First measurement: overall dataset

Second measurement: sub-region B (keyhole)+sub-region C0

Third measurement: sub-region B (keyhole)+sub-region C1

Fourth measurement: sub-region B (keyhole)+sub-region C2

Fifth measurement: sub-region B (keyhole)+sub-region C5

Sixth measurement: sub-region B (keyhole)+sub-region C6

Seventh measurement: sub-region B (keyhole)+sub-region C7

Eight measurement: sub-region B (keyhole)+sub-region C0 etc.

In this measuring method of the invention, thus, the complete overall dataset becomes fully updated in a cycle of six measurements—from the second measurement through the seventh measurement in the example. Due to the relatively small dimensions of the changing, respective, additionally registered sub-regions C0 through C2 and C5 through C7, the registration time is lengthened only slightly in comparison to a standard keyhole measurement sequence. Nonetheless, an image having relatively high edge sharpness is present due to the constant, cyclical updating of the overall dataset, even given moving measured subjects.

Figure 3:
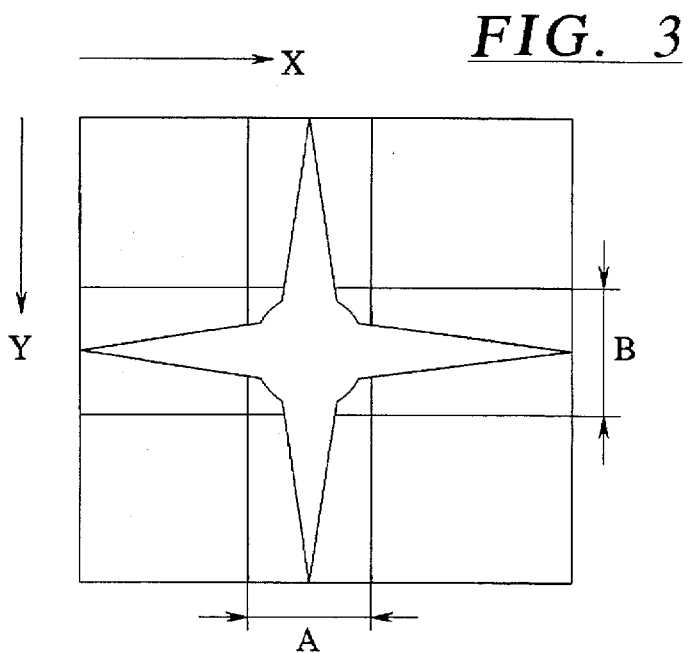
FIG. 3 is an illustration of a measuring method of the invention in a two-dimensional measurement shown in an illustration similar to that in FIG. 2, wherein only sub-regions of the overall dataset are updated in alternation.

In an illustration similar to FIG. 2, FIG. 3 shows a further version of a measurement sequence of the method of the invention. In this method, the sub-region of the overall dataset registered in every measurement—the keyhole—is formed only by the rectangular sub-region limited by broken lines in the center of the star-shaped, shaded measured data. This sub-region is the plane of intersection of two sub-regions A and B. The sub-region B extends in the X-coordinate direction over the entire measurement region through the center of the overall dataset and has the width B in the Y-coordinate direction. The sub-region A extends in the Y-coordinate direction over the entire measured region through the center of the overall dataset and has the width A in the X-coordinate direction. By far, the majority of the significant measured data are thus acquired in the sub-regions A and B.

In a measurement sequence of the invention, the sub-regions A and B are now registered in alternation. The plane of intersection of A and B thus forms the keyhole K registered in every measurement. Referring to the sub-region A minus the keyhole K as "remainder A" and the sub-region B minus the keyhole K as "remainder B," a registration sequence of the measured data regions arises as follows:

First measurement: overall dataset

Second measurement: keyhole K plus sub-region remainder A (=A),

Third measurement: keyhole K plus sub-region remainder B (=B),

Fourth measurement: keyhole K plus sub-region remainder A (=A),

Fifth measurement: keyhole K plus sub-region remainder B (=B), etc.

In this version of the measuring method of the invention, the overall dataset is in fact not completely updated; the measured data lying within the star-shaped region that is entered shaded, and which are critical for the image display, however, are re-acquired within only two measurements. Due to the extremely small keyhole region K in the center of the overall dataset, this being repeated in every measurement, and due to the changing sub-regions remainder A and remainder B directly adjoining the keyhole region K, an extremely rapid sequence of measurements can be achieved. At the same time, an extremely good edge sharpness is achieved by the changing, and thus highly current, information contained in the sub-regions remainder A and remainder B.

A combination of the two versions of the method of the invention described in FIG. 1 and in FIG. 2 is likewise possible. For example, the sub-regions A and B of FIG. 2 can be acquired in alternation and—as presented in FIG. 1—the measured data of subordinate significance that lie outside of the sub-regions A and B are then updated in a preselected cycle.

Figure 4:
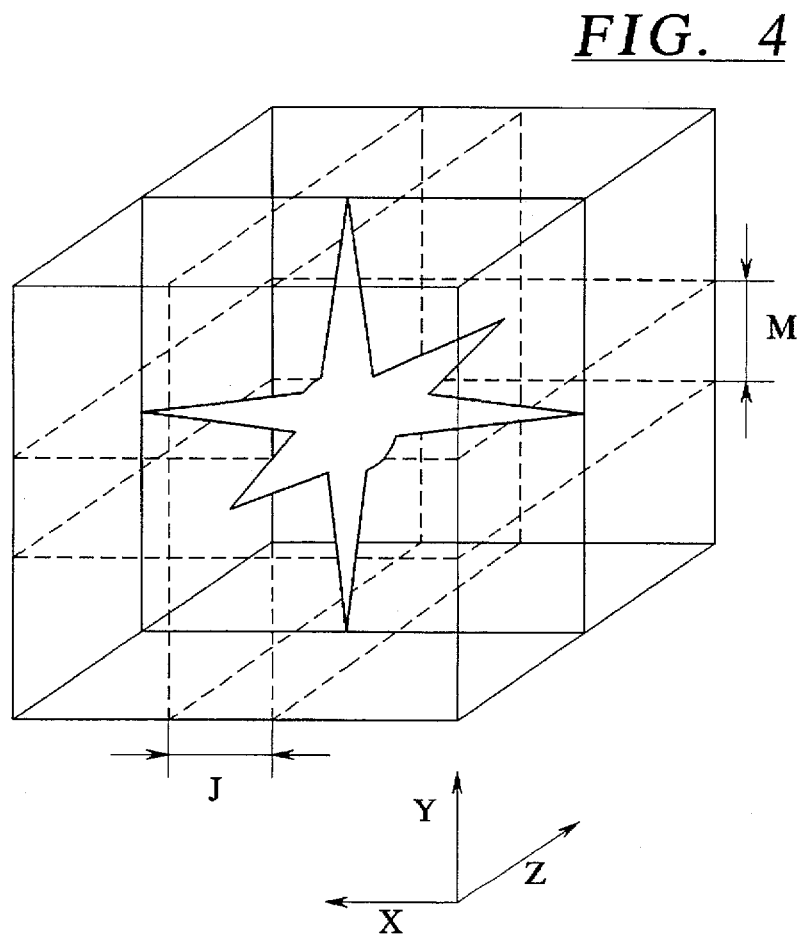
FIG. 4 is a schematic illustration of a measuring method of the invention for a three-dimensional dataset.

The measuring methods of the invention set forth in either FIG. 2 or in FIG. 3 for two-dimensional measurements can also be expanded to multi-dimensional measurements. FIG. 4 shows an example thereof. In addition to the two measurement coordinates X and Y, a third measurement coordinate Z is thereby entered. This references a further phase coordinate direction.

In FIG. 4, the three-dimensional sub-region of the measured data critical for the image display has the shape of a three-dimensional star extending along the X, Y and Z-coordinate axes. In known standard keyhole measurement sequences, the three-dimensional, overall dataset is first registered and only a three-dimensional sub-region is subsequently updated, this extending along the entire Z-measurement coordinate axis and having the width M in the Y-coordinate direction and the width J in the X-coordinate direction.

In a measuring method of the invention in accord with that set forth in FIG. 2, a further sub-region of the overall dataset that changes from measurement to measurement is always registered in addition to the acquisition of this central keyhole region until the complete overall dataset has been updated after a defined number of measurements.

Of course, an expansion of the measuring method of the invention set forth with reference to FIG. 2 to a plurality of dimensions is also possible. Multi-dimensional sub-regions of the overall dataset that extend along the measurement coordinate axes and that contain the measurement data that are primarily relevant for the image display are then registered in alternation.

The above-described embodiments of the inventive method have been described in the context of a standard keyhole method, wherein an overall (complete) dataset is first acquired in a measurement sequence. In the further embodiments of the inventive method respectively schematically illustrated in FIGS. 5 and 6, however, it is not necessary first to obtain a complete dataset. These embodiments are based on the perception, noted above, that the regions of the k-space which are primarily relevant for portraying structure in the displayed image, and for determining the signal-to-noise ratio, are those regions defined by the central (middle) lines of the phase-encoded data which is entered into the k-space data matrix. Measuring time can therefore be saved in the embodiments of the invention illustrated in FIGS. 5 and 6 by acquiring only a part of the overall dataset in the initial measurement sequence, this acquired part comprising the aforementioned central portion. The data subsequently acquired in the further measurements from each of the different sub-regions can then be added to this initially acquired portion of the case base data, until the complete k-space is covered.

Figure 5:
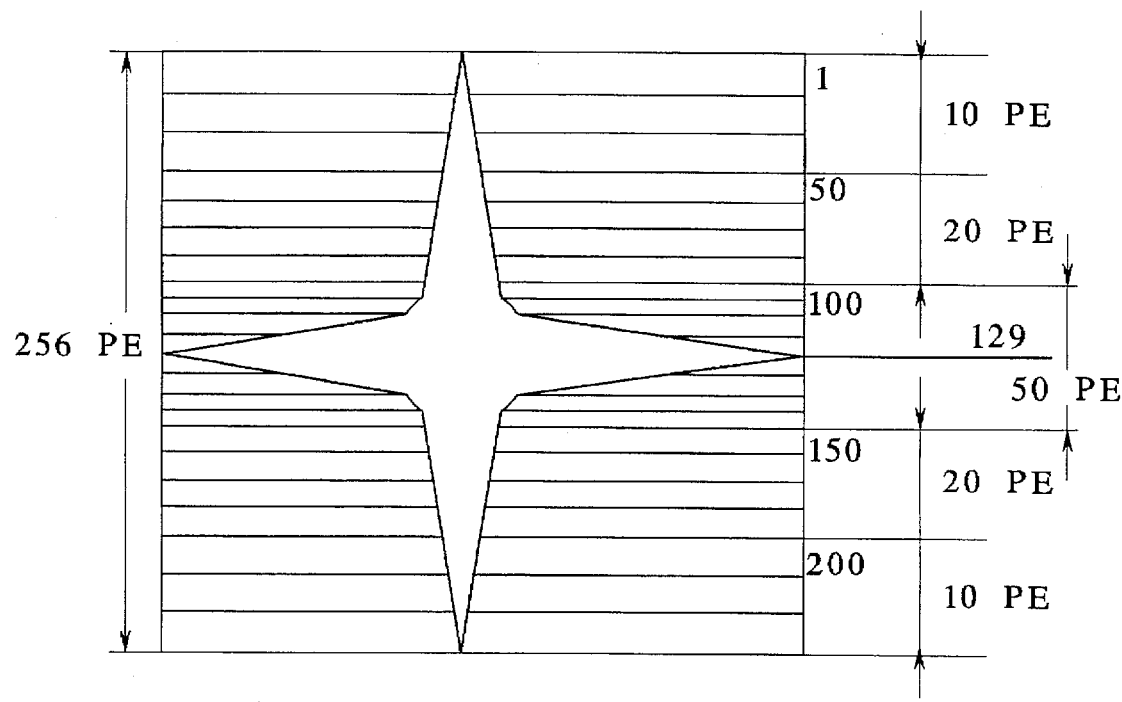
FIG. 5 is a schematic illustration showing the entry of data into the k-space matrix employing a weighted k-space sequence in accordance with the principles of the present invention.

In the embodiment shown in FIG. 5, the data arising in a so-called weighted k-space sequence is entered into the k-space matrix, which would ordinarily contain 256 lines of entered phase-encoding data, each line representing one phase-encoding step. In the embodiment shown in FIG. 5, only data for 110 steps of the possible 256 steps are entered. As can be seen, most of the image contents are located in the center of the k-space matrix. By acquiring only the center information (low spatial frequencies), almost all of the possible signal is obtained in the reconstructed image. Edge details which are located in the higher spatial frequencies outside the center band are not as important, and can be acquired in a coarser manner. The data for phase-encoding (PE) steps which was not acquired during the initial measurement can be filled in in PE lines using the data acquired in the subsequent measurements, or can be filled in by copying data into the k-space matrix which was obtained in a previously acquired reference image.

Figure 6:
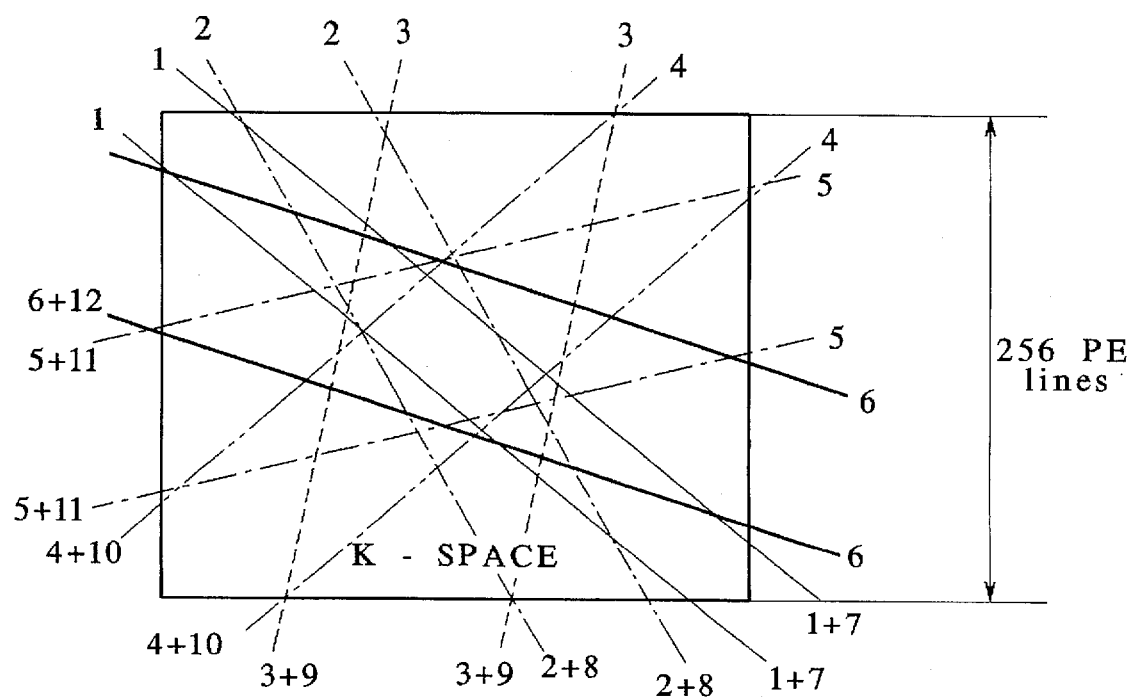
FIG. 6 is a schematic illustration showing the entry of data into the k-space matrix in a striped k-space sequence in accordance with the principles of the present invention.

In the embodiment shown in FIG. 6, a so-called striped k-space sequence is schematically illustrated. In this embodiment, k-space data are acquired using diagonal stripes. Each of the acquisition stripes (or bands) is limited by two parallel lines, which are identically numbered. The two lines numbered 1, for example, form the first acquisition stripe, the two lines numbered 2 define the second acquisition stripe, etc. The expressions with plus signs at the opposite ends of each pair of parallel lines indicate that data for that stripe is updated as the sequence proceeds clockwise around the k-space. Using this method, it is possible to acquire a complete k-space dataset with six stripes, with the updating ensuring high image quality. The central-most portion of the case base, which primarily defines the signal-to-noise ratio and the structural content of the portrayed image, is acquired with each stripe. Prior acquisition of a reference image for filling in "empty" data positions within the matrix, until filled by data obtained within a stripe, is preferable, but is not necessary.

The aforementioned advantages of the measuring method of the invention are preserved given employment thereof with three-dimensional and multi-dimensional datasets.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance imaging apparatus to obtain an image of a subject, comprising the steps of:

conducting a measurement of said subject by exciting nuclear spins in said subject and reading out nuclear magnetic resonance signals from said subject arising due to said nuclear spins to obtain a signal set;

digitizing at least a portion of said signal set to obtain an overall dataset in k-space containing data;

converting said data in said dataset in k-space into a displayable image of said examination subject; and conducting successive further measurements, corresponding to said measurement, for updating data in said dataset in k-space in at least two rectangular or perpendicular sub-regions of said dataset in k-space in alternation from measurement to measurement.

2. A method as claimed in claim 1, wherein said rectangular sub-regions each comprise a central part of said dataset in k-space.

3. A method for operating a magnetic resonance imaging apparatus to obtain an image of a subject, comprising the steps of:

conducting a measurement of said subject by exciting nuclear spins in said subject and reading out nuclear magnetic resonance signals from said subject arising due to said nuclear spins to obtain a signal set;

digitizing at least a portion of said signal set to obtain an overall dataset in k-space containing data;

converting said data in said dataset in k-space into a displayable image of said examination subject; and conducting successive further measurements, corresponding to said measurement, for updating data in said dataset in k-space by acquiring respective stripes of said dataset in k-space in successive measurements following said initial measurement, rotating said stripes in the k-space in successive measurements until covering a substantial portion of said dataset in k-space.

* * * * *